US012803613B2

(12) United States Patent
Rajendran et al.

(10) Patent No.: US 12,803,613 B2
(45) Date of Patent: Nov. 17, 2026

(54) ON-CHIP NOISE MEASUREMENT IN A TRANSCEIVER, METHOD AND SYSTEM THEREOF

(71) Applicants: Renesas Electronics Corporation, Tokyo (JP); Steradian Semiconductors Private Limited, Bengaluru (IN)

(72) Inventors: Gireesh Rajendran, Bengaluru (IN); Alok Prakash Joshi, Bengaluru (IN); Xu Zhishan, Tokyo (JP)

( * ) Notice: Subject to any disclaimer, the term of this patent is extended or adjusted under 35 U.S.C. 154(b) by 281 days.

(21) Appl. No.: 18/418,336

(22) Filed: Jan. 21, 2024

(65) Prior Publication Data

US 2025/0112663 A1 Apr. 3, 2025

(51) Int. Cl.

*H04B 1/40* (2015.01)
*H03L 7/099* (2006.01)
*H04L 5/00* (2006.01)

(52) U.S. Cl.

CPC ............... *H04B 1/40* (2013.01); *H03L 7/099* (2013.01); *H04L 5/0048* (2013.01)

(58) Field of Classification Search

CPC .......... H04B 1/40; H03L 7/099; H04L 5/0048
See application file for complete search history.

(56) References Cited

U.S. PATENT DOCUMENTS

| | | | | |
|---|---|---|---|---|
| 7,856,048 | B1 * | 12/2010 | Smaini | H04B 1/30 455/115.2 |
| 11,387,833 | B1 * | 7/2022 | Li | H03L 7/081 |
| 2013/0058387 | A1 * | 3/2013 | Muhammad | H04B 15/04 375/222 |
| 2013/0058388 | A1 * | 3/2013 | Muhammad | H04B 15/04 375/222 |
| 2017/0257137 | A1 * | 9/2017 | Matsumura | H04B 1/16 |

* cited by examiner

*Primary Examiner* — Junpeng Chen

(57) ABSTRACT

According to an aspect, a transceiver comprises a transmitter section having a first PLL (phased locked loop) providing a first reference signal to the transmitter section, a receiver section having a second PLL providing a second reference signal to the receiver section, a coupler coupling the second PLL to the transmitter section when the transceiver is operative in a test mode measuring a first noise component introduced by the first PLL. The first reference signal is coupled to the receiver section internally within the transceiver as a local reference signal to the receiver section both in the test mode and a functional mode.

7 Claims, 3 Drawing Sheets

ON-CHIP NOISE MEASUREMENT IN A TRANSCEIVER, METHOD AND SYSTEM THEREOF

CROSS REFERENCES TO RELATED APPLICATION

This application claims priority from Indian Patent Application number 202341035613 filed on May 23, 2023 which is incorporated herein in its entirety by reference.

BACKGROUND

Technical Field

Embodiments of the present disclosure relate generally to low noise electronic system and more specifically to an on-chip noise measurement in a transceiver, method and system thereof.

Related Art

An integrated circuit or an electronic system comprising a transmitter and a receiver are often referred to as Transceiver. The transmitter and the receiver are built on a single substrate in case of integrated circuit or on a same board (like of printed circuit board) in case of the system. Anyways, in the transceiver, the resources (and signals at any points) employed for implementing transmitter and the receivers may be conveniently accessed/interconnected by and between them.

Electronics (elements, components, functional units, circuits forming the transmitter and/or receiver) employed for transmitting a signal (similarly for receiving the signal on receiver side) often introduce noise and jitter. Generally, the noise generated by the electronics of transmitter and receiver is computed based on the design or measured on deployment, to calibrate and compensate for improved performance.

However, as is well known, the performance of the electronics degrades due to aging and or changing operational conditions like temperature. Thus, the noise introduced by the electronics may be required to be measured often (as against one time) to estimates the noise introduced at different point in time and at different operating conditions to compensate for the noise more accurately, at least when transceivers are deployed for sensitive operations.

Conventionally, a replica of the electronics, a part thereof, replica of functional units, replica of only elements that most likely or major contributor of noise (generally referred hereafter as "replica") are deployed on the transceiver to compare and estimate the noise introduced by the original corresponding electronics part. Example of such conventional technology is more fully described in the U.S. Pat. Nos. 9,696,359 B2 and 10,928,447 B2, and that are incorporated herein by reference.

Apparently, such conventional techniques of forming replica electronics of the desired parts consume area on the integrated circuit (on-chip) and power too. Further, accuracy of noise measurement/estimation is limited by the performance of the replica. An attempt on deploying the low noise replica consumes larger area/power on the chip. On the other hand, if the area is compromised, then the performance of the replica (its own noise) limits the accurate estimation of noise.

SUMMARY

According to an aspect, a transceiver comprises a transmitter section having a first PLL (phased locked loop)

providing a first reference signal to the transmitter section, a receiver section having a second PLL providing a second reference signal to the receiver section, a coupler coupling the second PLL to the transmitter section when the transceiver is operative in a test mode measuring a first noise component introduced by the first PLL. Wherein the first reference signal is coupled to the receiver section internally within the transceiver as a local reference signal to the receiver section both in the test mode and a functional mode.

According to yet another aspect, the transceiver further comprises a coupler generating a third reference signal from the second reference signal, a transmit front end electronics, wherein the first PLL and the transmit front end electronics are within the transmitter section, and a first selector switch operative to couple the third reference signal to the transmit front end electronics in the test mode and couple the first reference signal to the transmit front end electronics in the functional mode, wherein, the third reference signal is commensurate with the first reference signal. Wherein the receiver section comprising a receiver front end electronics, wherein the transmitter section and the receiver section are operative in conjunction to transmit a radar signal over a first antenna and process a reflected radar signal received on a second antenna respectively in the functional mode.

According to another aspect the transceiver further comprises a testing path comprising switches and an attenuator operative to couple the transmitter output to the input of the receiver front end electronics in the test mode wherein, the receiver front end electronics employing the local signal to convert the said third reference signal in the test mode and the said reflected radar signal in the function mode to a first intermediate frequency (IF) signal. Wherein the receiver section further comprising an ADC operative to convert the IF signal to digital data, wherein the ADC is operative at a first sampling frequency derived of the second PLL.

According to another aspect, the coupler comprising a multiplier and divider configured as: $F_{VCO1}\times N-(F_{VCO2}+F_{VCO2}/K)\times N=F_{IF}$, wherein, the $F_{VCO2}$ representing frequency of the second reference signal, K and N are integers, $F_{VCO1}$ representing the frequency of the first reference signal and $F_{IF}$ representing the frequency of the IF signal. Wherein, in the test mode, the noise due to the second PLL is cancelled at the ADC and only the noise due to the first PLL is measured after the ADC.

Several aspects are described below, with reference to diagrams. It should be understood that numerous specific details, relationships, and methods are set forth to provide a full understanding of the present disclosure. One who skilled in the relevant art, however, will readily recognize that the present disclosure may be practiced without one or more of the specific details, or with other methods, etc. In other instances, well-known structures or operations are not shown in detail to avoid obscuring the features of the present disclosure.

DETAILED DESCRIPTION OF THE PREFERRED EXAMPLES

Figure 1:
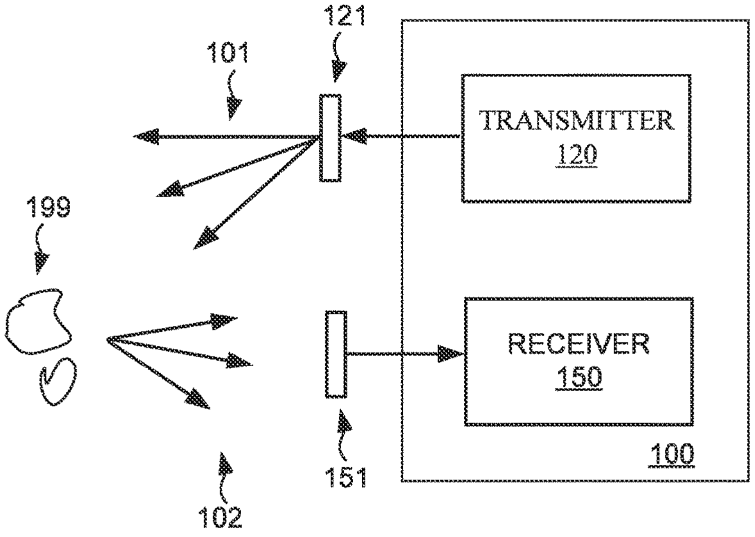
FIG. 1 is a block diagram illustrating a transceiver in an embodiment.

FIG. 1 is a block diagram illustrating a transceiver in an embodiment. The transceiver 100 is shown comprising a transmitter module 120 and a receiver module 150. The transmitter is shown transmitting a radar signal 101 thorough antennas 121 and a received signal 102 is the signal reflected from an object 199 and is shown received on the antenna 151 of the receiver module 150. The antenna 121 and 151 may comprise plurality of antenna elements operative in a multiple input and multiple outputs (MIMO) configuration as well known. Further, the antenna 121 and 151 may also be deployed in any other known configurations for radar operations for object detection, navigation, terrain mapping etc.

The transmitter 120 may be configured to transmit a radar signal for object detection. The radar signal may comprise a frequency tone (often referred to as radar pulse) as in pulsed radar and/or a signal that is varying in frequency (often referred to as chirp) as in FMCW (frequency modulated continuous wave) radar.

Figure 2A:
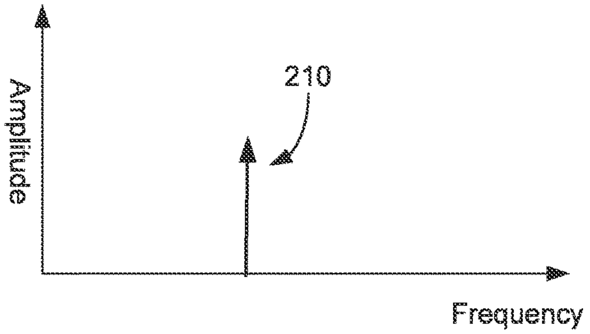
FIG. 2A is an example output spectrum of ideal radar receiver.
Figure 2B:
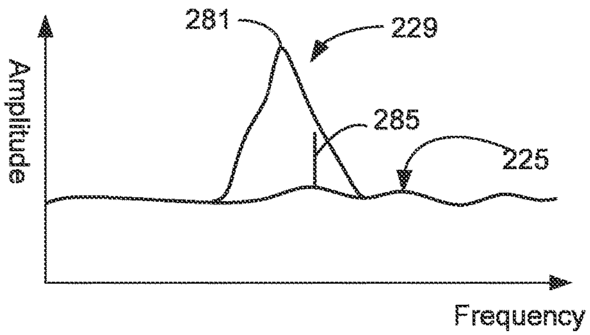
FIG. 2B is an example output spectrum of real radar receiver.

An example pulse radar signal is depicted in FIG. 2A and FIG. 2B. In FIG. 2A, the pulse 210 represents frequency spectrum of a typical ideal radar signal while detecting a single object. In FIG. 2B, the graph 220 represents an example spectrum of the received real radar signal, in that, the received signal 220 is shown comprising a flat-over-frequency noise 225 and a noise around the signal 229. The noise around the signal 229 comprises the multiplicative noise introduced by the PLL, transmitter 120 and receiver 150, at least predominantly when not compensated. While the flat-over-frequency noise 225 may be due to additive channel noise, at least predominately. Such noise around signal 229 affect the ability of the radar to detect the objects like small objects in close vicinity of the larger objects, two objects close to each other, etc. As shown in the FIGS. 2A and 2B, the first object (say larger object) is depicted by peak 281 and the second objected (say a smaller object) 285 is depicted by peak 285. As may be appreciated, the noise around signal 229 has masked the ability to detect the second object 285. Thus, measuring the noise introduced by the transmitter 120 (for example 229) and correcting/compensating for the same at the receiver is necessitated to reduce the effect of the noise due to the transmitter 120.

As noted in the earlier sections, conventional techniques employs replica to measure the noise introduced by the transmitter and account correct/compensate for the same at the receiver. Such conventional techniques suffers from its own limitations like power and area when the replica is implemented with low noise version on one hand and limiting the ability to measure the noise to an extent of its own noise when area and power are compromised. That, being the general limitations of the conventional systems, they do not meet the high performance requirements as in radar system employed for the navigation and object detection and mapping.

Figure 3:
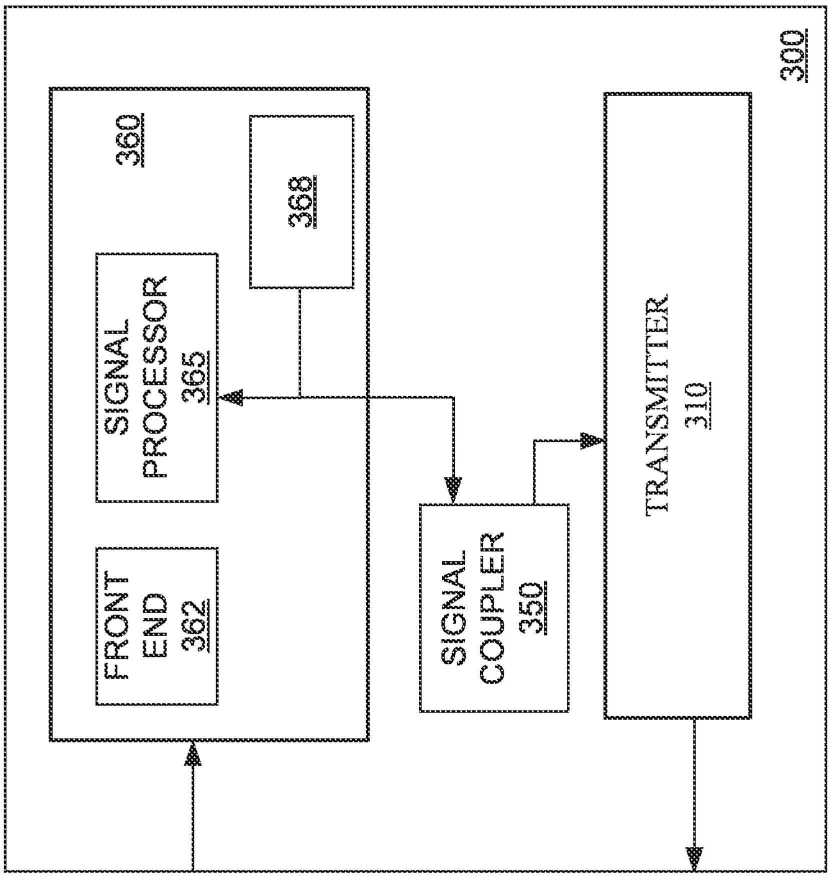
FIG. 3 is a transceiver in an embodiment of the present disclosure.

FIG. 3 is a transceiver in an embodiment of the present disclosure. The transceiver 300 is shown comprising transmitter 310, receiver 360 and signal coupler 350. In that, the receiver 360 is shown comprising receiver front end (electronics) 362, signal processor 365 and receiver reference signal generator 368. Each block is described in further detail below.

The transmitter 310 generates and transmits radar signal (for example) though one or more antenna (not shown). The transmitter 310 may comprise several functional devices and electronic circuitry operative to generate a reference frequency signal, clock signal, modulator, amplifiers, filters etc.

The receiver 360 receives a signal that maintains one or more (desired) references with the transmitted radar signal. For example, the signal received on the receiver may be phase shifted, frequency shifted, delayed in time, etc. of the transmitted radar signal. Further, several other signal parameters may get altered in the course propagation, reflection, and/or processing. For example, the channel may alter the signal parameters, object and other physical structure may reflect/scatter the signal, and a device may process and retransmit the signal, thus causing change in the one or more signal characteristic/parameter. Such change in the characteristic/parameters often carries information and thus, placing a requirement for measuring such changes in the characteristic/parameters of the signal more accurately. The receiver 360 is configured to extract the information from the received signal by comparing with the transmitted radar signal. The receiver 360 is further described below.

The receiver front end 362 performs initial signal detection and conditioning operations. For example, the receiver front end 362 may comprise the antenna for converting electromagnetic signal to electrical signal, a filter to eliminate the signal in the undesired frequency band, amplifier and impedance matching elements for example. In one embodiment, the receiver frontend 362 may convert the received signal at high frequency to an intermediate frequency (IF) signal.

The signal processor 365 is configured to perform several signal processing operations suitable for extraction of information from the IF signal. For example, the signal processor 365 may perform analog to digital conversion (ADC), demodulation, signal transformations like Fourier transformations etc. The signal processor 365 may comprise plurality of the devices together operative to perform the respective signal processing in conjunction with other. Alternatively, the signal processor 365 may be a general purpose processor executing series of instructions performing the desired operations and/or combinations thereof. As a further alternative, the signal processor 365 may be an SOC (system on chip) device. One or more functional block/device and/or elements in the signal processor 365 may operate with a reference clock/frequency.

The receiver reference signal generator 368 generates and provides a reference signal (or clock signal of desired frequency) to the at least one of the receiver front end 362 and to the signal processor 365. The receiver reference signal generator 368 is configured to generate the reference signal as per the processing requirement of the signal processor 365. In one embodiment the receiver reference signal generator 368 is integral part of the receiver 360.

The coupler 350 is operative to selectively couple the output of the receiver reference signal generator 368 to the transmitter 310. For example, the coupler 350 may couple the output of the receiver reference signal generator 368 to any part of the transmitter 310 or to the specific point on the transmit path within the transmitter 310. In one embodiment, the coupler 350 may adjust the parameter of the reference signal generated by the receiver reference signal generator 368 to suitably match the reference signal of the transmitter 310 or the signal on the transmitter 310 at the point of coupling.

In one embodiment, the coupler 350 couples the output of the receiver reference signal generator 368 to the transmitter

310 when the transceiver 300 is operative in calibration mode. That is, when the noise due to transmitter 310 is desired to be measured, the coupler 350 couples the output of the receiver reference signal generator 368 to the transmitter 310. Thus, the coupler 350 and the receiver reference signal generator 368 are together operative as the replica for measuring the noise due to the transmitter 310. Apparently, reducing the hardware (and power) required to build (and operate) a replica as in the conventional transceiver. Further, a high precision electronics implemented for processing the received signal is made available to the transmitter for the noise measurement (also referred to as calibration), that otherwise would be more expensive and area consuming if a replica of similar precession electronics to be incorporated on the transmitter. The manner in which built-in testing may be performed without a replica is further illustrated.

Figure 4:
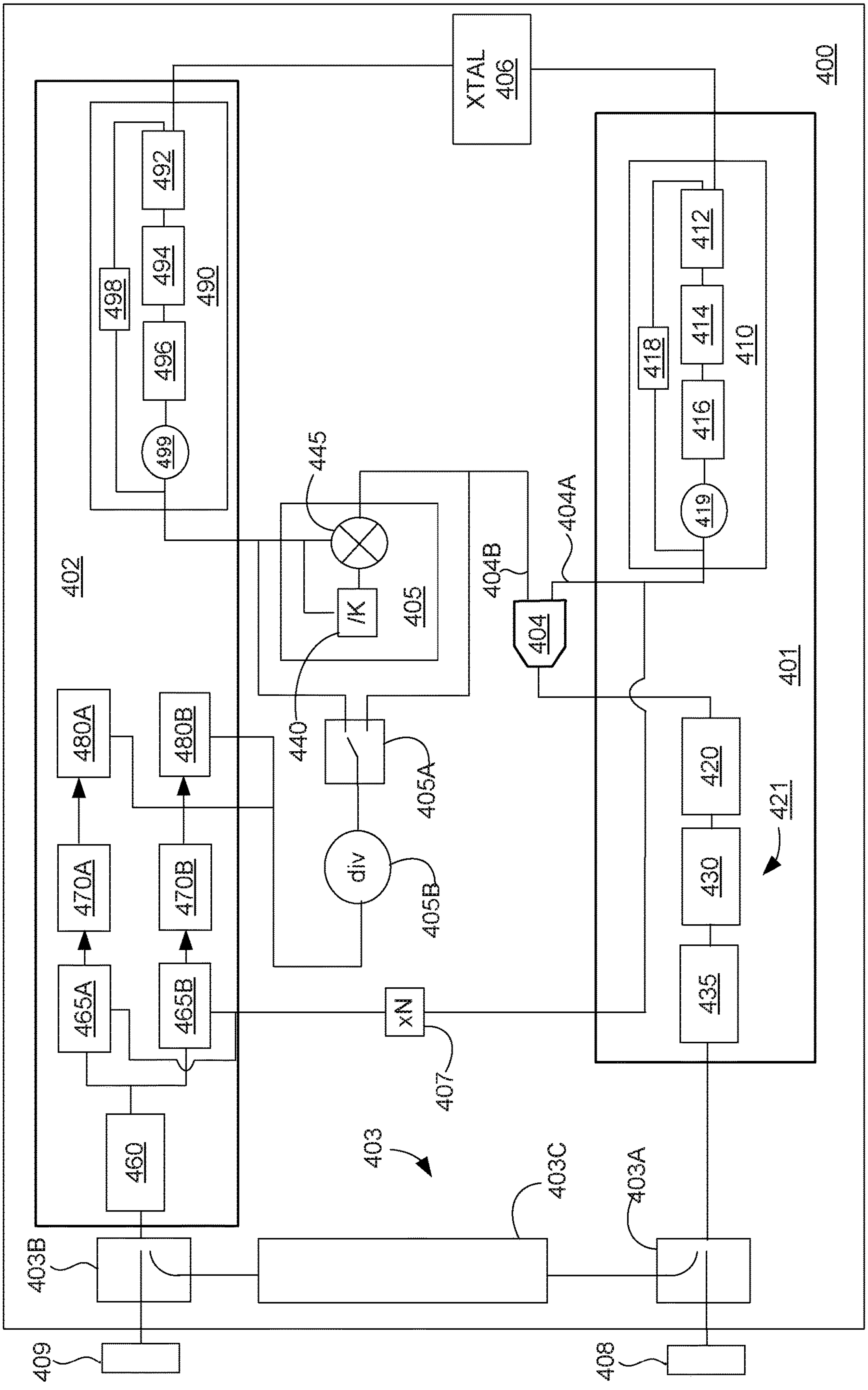
FIG. 4 is a transceiver with an on-chip noise measurement in an embodiment.

FIG. 4 is a transceiver with an on-chip noise measurement in an embodiment. The transceiver 400 (block diagram) is shown comprising transmitter section 401 and receiver section 402, testing path 403, multiplexer 404, coupler 405, and crystal 406. In that, the transmitter section 401 is shown comprising transmitter PLL (phase locked loop) 410, up-convertor 420, phase shifter 430, power amplifier 435. In that the up-convertor 420, Phase shifter 430 and power amplifier 435 together form a transmitter front end (electronics).

Similarly, the receiver section 402 is shown comprising low noise amplifier (LNA) 460, mixers 465A and 465B, filter 470A and 470B, analog to digital convertors (ADCs) 480A and 480B, receiver PLL 490. The coupler 405 is shown comprising divider 440 and mixer 445. Each element is further described in detail below. In that, the LNA 460, mixers 465A and 465B and filters 470A and 470B form the receiver front end.

In the transceiver 400, the transmitter section 401 is operative to generate a radar signal and transmit the radar signal over the antenna 408. The radar signal may be a pulsed radar signal, FMCW (frequency modulated continuous wave) radar signal like Chirp. The intended radar signal is generated through the PLL 410. The crystal 406 provides an oscillating raw signal to the PLL 410 and 490.

The PLL 410 is operative to generate a very highly stable reference signal. For example the PLL 410 may be configured to generate a frequency modulated signal or a constant frequency signal as may be the case. In the frequency modulated signal, the frequency of the signal is varied (linearly, for example) to generate an FMCW radar signal. Similarly, the PLL 410 may be configured to generate constant frequency pulses representing a radar pulse. As the signal generated by the PLL 410 forms a basis and reference for subsequent measurement and performance of transceiver 400, it is utmost important to implement the PLL 410 with high precession and also track the noise generated by the PLL 410 for accurate measurement.

The PLL 410 is shown comprising phase detector 412, charge pump 414, loop filter 416, divider 418, voltage controlled oscillator (VCO) 419. The phase detector 412, charge pump 414, loop filter 416, divider 418, voltage controlled oscillator (VCO) 419 operate in conjunction to generate a stable reference signal. In that, VCO 419, the charge pump 414 and phase detector 412 may generate significant noise and thus may alter the reference signal parameters (stability). In other words, the elements of the PLL 410 (majorly 419, 414 and 412) may cause error/noise in the reference signal as noted in respect of FIGS. 2A and 2B above. The reference signal so generated by the PLL 410 is provided to selector switch (multiplexer) 404 as one of the inputs on the terminal 404A.

The selector switch 404 connects one of the reference signals from the PLL 410 and the test signal received from the coupler 405 to the up-convertor 420. The selector switch 404 is operative in two modes, a functional mode and test mode (or calibration mode). In the functional mode, the transceiver 400 is operative to transmit the radar signal and receive the reflected signal to determine the object, shape etc., as desired. On the other hand, in the test mode, the transceiver 400 is operative to measure noise due to its own elements for calibration and compensation. Accordingly, the selector switch 404 couples signal from the PLL 410 to transmit path (421) in the functional mode and couples the test signal from the coupler 405 in the test mode.

The up-convertor 420, phase shifter 430, power amplifier 435 of the transmitter section 401 respectively perform up-conversion (in the frequency) of the signal received, perform phase shift and amplify the signal level suitable for transmission for desired purpose. Like for example, the up-convertor may shift the centre frequency of the signal to a very high frequency in the rage of 13 GHz-80 GHz, for example or to any frequency range well known the relevant art.

In the transceiver 400, the receiver section 402 is operative to receive reflected radar signal over the antenna 409 and process the received reflected radar signal to detect the objects and its parameters. The receiver section 402 is shown comprising low noise amplifier (LNA) 460, mixers 465A and 465B, filter 470A and 470B, analog to digital convertors 480A and 480B, receiver PLL 490. In that, (LNA) 460, mixers 465A and 465, filter 470A and 470B are operative to process the In-phase and Quadrature phase signals (differential signal) by amplifying, down converting, and filtering respectively. For example, the LNA 460 may amplify the signal received on the antenna 409 and provide a differential signal (I and Q), each I and Q signal are then down-converted by mixing, and filtering operation. The down converted and filtered signal received from the filters 470A and 470B are provided to the ADCs 480A and 480B.

The ADCs 480A and 480B samples the analog differential signals received from the respective filters 470A and 470B to generate the digital sequence of data representing the reflected radar signal. In one embodiment the sampling frequency (sampling rate) of ADCs are operated by a high precession and stable reference signal generated by the PLL 490. In view of the rigorous processing of the received signal for determining the several parameters like, object range, velocity, shape, etc, the receiver may be operated at different frequency suitable for performing the operations of range estimation, Doppler estimation, azimuth, elevation estimation, etc. In one embodiment, the high precession and stable reference signal is generated by the PLL 490 to process the signal in the receiver section to more accurate extraction of the information.

The PLL 490 is operative to generate stable reference signal. For example the PLL 490 may be configured to generate a reference clock signal, sampling clock signal, or a constant frequency signal as may be the case. The PLL 490 may be configured to generate constant reference clock signal and provided to the pair of ADCs 480A and 480B. As the signal generated by the PLL 490 forms a basis and reference for data conversion and extraction of information, the PLL 490 may be implemented as low noise high precession reference signal generator.

The PLL 490 is shown comprising phase detector 492, charge pump 494, loop filter 496, divider 498, voltage controlled oscillator (VCO) 499. The phase detector 492, charge pump 494, loop filter 496, divider 498, voltage controlled oscillator (VCO) 499 operate in conjunction to generate a stable reference signal. The reference signal so generated by the PLL 490 is provided to ADCs 480A and 480B and the coupler 405.

The testing path 403 is shown comprising the route switches 403A, and 403B, and attenuator 403C. In that, route switch 403A couples a part of the signal received for transmission to antenna 408 to the attenuator in the test mode. Similarly, the route switch connects the signal received through the attenuator to the LNA 460 in the test mode. The attenuator provides the signal attenuation that is commensurate with maximum signal level that the LNA 460 would receive in the functional mode.

The coupler 405 operate to adjust/modify/change the reference frequency value of the PLL 490 and couples the adjusted reference signal to the select switch 404 on the second terminal 404B. In one embodiment, in the coupler 405, the divider 440 and multiplier 445 together operative to increase or decrease the reference frequency of the PLL 490 close to within IF frequency divided by N of that of the reference frequency of the PLL 410. Several switches like selector 404, route switch 403A & B, and coupler switch 405A are operative to place the transceiver 400 in functional mode or test mode.

In operation, in the functional mode, the selector switch 404 couples the signal on 404A to the up-convertor 420, the route switch 403A couples the signal from power amplifier 435 to the antenna 408 for transmission, the route switch 403B couples the signal from antenna 409 to the LNA 460, and the coupler switch 405A couples the output of the PLL 490 to the ADCs 480A and 480B (Optionally though divider 405B). The mixers 470A and B mixes the received signal with the up-converted reference signal of the PLL 410, (optionally employing the up-convertor 407, not limiting thereto to only up-convertor). The noise introduced by the elements 420, 430, 435 (part of the transmitter section), 460, 465 and 470A& B (part of the receiver section) usually dominates the additive noise 225. The noise introduced by the elements of the PLL 410 (like 412, 414, 416, 418 and 419) dominates the multiplicative noise 229 and may affect the performance of the transceiver 400. Thus the transceiver may be (often or on a predetermined time, or on certain condition) operated in the test mode to measure the noise introduced by the PLL 410.

In operation, in the test mode, the selector switch 404 couples the signal on 404B to the up-convertor 420, the route switch 403A couples a portion of the signal from power amplifier 435 to the attenuator 403C for feedback to receiver section, the route switch 403B couples the signal from attenuator 403C to the LNA 460, and the coupler switch 405A couples the output of the coupler 405 to the ADCs 480A and 480B. The mixers 470A and B mixes the feedback signal with the up-converted reference signal of the PLL 410. The noise due to the PLL 490 is cancelled due to self sampling. That is, the ADCs 480A and B samples the signal that is generated by itself. However, the noise introduced by the elements of the PLL 410 (like 412, 414, 416, 418 and 419) is passed through the up-convertor 407, mixers 465A and B, filters 470A and B and ADCs 480A and B remains at the outputs of the ADCs 480A and B. Thus, in the test mode, the measurement of the noise at the output of the ADC 480A and B corresponds to the noise introduced by the PLL 410.

Due to the above arrangement, the noise due to PLL 410 may be measured, calibrated and corrected without using any replica. Thus reducing the silicon area, power and complexity of the transceiver 400 and enhancing the performance thereof.

In one embodiment, the second PLL (490) used to generate the clock for the on-chip ADC is passed through a divider-mixer combination and sent to the transmitter through a multiplexer switch during the noise test mode. From the transmitter output a coupler-attenuator combination is used to send a portion of the signal to the receive path. This received signal is down converted and digitized in a way similar to the functional mode. The mixer input frequency and divider of the divider-mixer combination is selected such as to create a down converted frequency within the receive filter and ADC band. $F_{VCO1}\times N-(F_{VCO2}+F_{VCO2}/K)\times N=F_{IF}$. Wherein, the $F_{VCO2}$ representing the second PLL reference signal frequency value, K and N are integers, $F_{VCO1}$ representing the frequency of the reference signal from PLL 410 and $F_{IF}$ representing the intermediate frequency at the output of the mixers 465A and B. Noise from the second PLL and mixer is part of the common path till the ADC sampling clock and this noise/jitter is eliminated by the sampling operation of the ADC. The spectrum at the output of the ADC shows all the un-correlated noise from PLL1 (410), Tx and Rx path with respect to PLL2. This represents the noise that is of interest and is measured. Due to this technique, no additional PFD, Charge pump, I to V (current to voltage converts) or quantizer are required, as in the conventional prior-art cited in the above section that can limit the measurement accuracy.

While various examples of the present disclosure have been described above, it should be understood that they have been presented by way of example, and not limitation. Thus, the breadth and scope of the present disclosure should not be limited by any of the above described examples, but should be defined in accordance with the following claims and their equivalents.

What is claimed is:

1. A transceiver comprising:

a transmitter section having a first PLL (phased locked loop) providing a first reference signal to the transmitter section;

a receiver section having a second PLL providing a second reference signal to the receiver section; and a coupler coupling the second PLL to the transmitter section when the transceiver is operative in a test mode measuring a first noise component introduced by the first PLL wherein the first reference signal is coupled to the receiver section internally within the transceiver as a local reference signal to the receiver section both in the test mode and a functional mode.

2. The transceiver of claim 1, further comprising:

a transmit front end electronics within the transmitter section;

a selector switch is coupled to the transmitter section and the coupler; and a divider and multiplier combination within the coupler, wherein the divider and multiplier combination operative to convert the second reference signal to a third reference signal as an output of the coupler, the selector switch is operative to couple the third reference signal to the transmitter front end electronic in the functional mode, and the third reference signal is commensurate with the first reference signal.

3. The transceiver of claim 2, wherein the receiver section comprising a receiver front end electronics, wherein the transmitter section and the receiver section are operative in conjunction to transmit a radar signal over a first antenna and process a reflected radar signal received on a second antenna respectively in the functional mode.

4. The transceiver of claim 3, further comprising a testing path comprising one or more switches and an attenuator operative to couple the third reference signal to the input of the receiver front end electronics in the test mode and coupling the reflected radar signal in the functional mode, wherein the receiver front end electronics employing the local signal to convert the said third reference signal in the test mode and the said reflected radar signal in the function mode to a first intermediate frequency (IF) signal.

5. The transceiver of claim 4, wherein the receiver section further comprising an ADC operative to convert the IF signal to digital data, wherein the ADC is operative at a first sampling frequency derived of the second PLL.

6. The transceiver of claim 5, wherein the divider and multiplier combination is configured as: $F_{VCO1} \times N-(F_{VCO2}+F_{VCO2}/K) \times N=F_{IF}$, wherein, the $F_{VCO2}$ representing frequency of the second reference signal, K and N are integers, $F_{VCO1}$ representing the frequency of the first reference signal and $F_{IF}$ representing the frequency of the IF signal.

7. The transceiver of claim 6, wherein, in the test mode, the noise due to the second PLL is cancelled at the ADC and only the noise due to the first PLL is measured after the ADC.

* * * * *